United States Patent
Okuyama et al.

(10) Patent No.: US 11,443,217 B2
(45) Date of Patent: Sep. 13, 2022

(54) INFORMATION PROCESSING APPARATUS AND INFORMATION PROCESSING METHOD

(71) Applicant: Hitachi, Ltd., Tokyo (JP)

(72) Inventors: Takuya Okuyama, Tokyo (JP); Masato Hayashi, Tokyo (JP); Masanao Yamaoka, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 1176 days.

(21) Appl. No.: 15/963,822

(22) Filed: Apr. 26, 2018

(65) Prior Publication Data

US 2019/0130295 A1    May 2, 2019

(30) Foreign Application Priority Data

Oct. 30, 2017  (JP) .............................. JP2017-209112

(51) Int. Cl.
*G06N 7/00* (2006.01)
*G06F 17/11* (2006.01)
(Continued)

(52) U.S. Cl.
CPC ................ *G06N 7/00* (2013.01); *G06F 7/00* (2013.01); *G06F 7/026* (2013.01); *G06F 7/588* (2013.01);
(Continued)

(58) Field of Classification Search
CPC .......... G06N 7/00; G06N 5/003; G06N 10/00; G06F 7/588; G06F 7/00; G06F 7/026;
(Continued)

(56) References Cited

U.S. PATENT DOCUMENTS 10,929,750 B2 *   2/2021   Tomita .................... G06N 3/04
2016/0063725 A1   3/2016   Yoshimura
(Continued)

FOREIGN PATENT DOCUMENTS

JP         2016-51313 A    4/2016

OTHER PUBLICATIONS

S.V. Isakov et al. "Optimised Simulated Annealing for Ising Spin Glasses", Computer Physics Communications 192, 2015, pp. 265-271.

(Continued)

*Primary Examiner* — Mohamed Charioui
(74) *Attorney, Agent, or Firm* — Crowell & Moring LLP

(57) ABSTRACT

It is possible to perform a stochastic process based on a metropolis algorithm while reducing a physical quantity of a circuit. Provided is an information processing apparatus including one or a plurality of array circuits. In this apparatus, each of the array circuits includes a plurality of units, and each of the plurality of units includes a first memory that stores a value indicating a state of one node of a coupling model, a second memory that stores a coupling coefficient indicating coupling from a node of another unit connected to an unit of the second memory, and a logic circuit that determines a value indicating a subsequent state of the one node based on a value indicating a state of the node of the other unit and the coupling coefficient. Further, the logic circuit sets a first random variable in accordance with an exponential distribution of a parameter θ as an input.

11 Claims, 12 Drawing Sheets

(51) Int. Cl.
  *G06F 17/18* (2006.01)
  *G06F 7/58* (2006.01)
  *G06N 5/00* (2006.01)
  *G06F 7/02* (2006.01)
  *G06F 7/00* (2006.01)
  *G06F 30/00* (2020.01)
  *G06N 10/00* (2022.01)

(52) U.S. Cl.
  CPC .............. *G06F 17/11* (2013.01); *G06F 17/18* (2013.01); *G06F 30/00* (2020.01); *G06N 5/003* (2013.01); *G06N 10/00* (2019.01)

(58) Field of Classification Search
  CPC . G06F 7/58; G06F 17/11; G06F 17/10; G06F 17/00; G06F 17/18; G06F 30/00; G06F 30/20; G06F 30/30
  See application file for complete search history.

(56) References Cited

U.S. PATENT DOCUMENTS

2016/0064053 A1* 3/2016 Yamaoka ............... G06N 7/005
                                                                711/103
2018/0075342 A1* 3/2018 Tamura ................ G06N 3/0445

OTHER PUBLICATIONS

Thomas H. Fischer et al., "A New Optimization Technique for Artificial Neural Networks Applied to Prediction of Force Constants of Large Molecules" Journal of Computational Chemistry, 1995, vol. 16, No. 8, pp. 923-936.
Tim Joachim Zuehlsdorff, "Computing the Optical Properties of Large Systems", Springer, 2015.
Vasil S. Denchev et al., "What is the Computational Value of Finite Range Tunneling?", Google, Inc., pp. 1-17.

* cited by examiner

SPIN

INFORMATION PROCESSING APPARATUS AND INFORMATION PROCESSING METHOD

TECHNICAL FIELD

The present invention relates to an information processing apparatus and method, and is particularly suitable for application to an information processing apparatus that controls a semiconductor device calculating a coupling model as an accelerator.

BACKGROUND ART

Various physical phenomena and social phenomena can be represented by a coupling model. The coupling model is a model defined by a plurality of nodes included in a model, coupling between nodes, and a bias for each node as necessary. Various models have been proposed in physics and social science, and each of the models can be interpreted as one form of the coupling model.

As a typical example of the coupling model in the world of physics, an Ising model can be mentioned. The Ising model is a model of statistical mechanics to describe a behavior of a magnetic body. The Ising model is defined by a spin having a binary value of +1/−1 (or 0/1, up/down), a coupling coefficient indicating coupling between spins, and a bias coefficient for each spin.

The Ising model includes a given spin configuration, a coupling coefficient, and a bias coefficient. An energy function (also generally referred to as Hamiltonian) of the Ising model is expressed by the following equation.

[Equation 1]

$$H(\sigma) = -\sum_{i<j} J_{i,j}\sigma_i\sigma_j - \sum_i h_i\sigma_i \quad (1)$$

Equation 1

Note that $\sigma_i$ and $\sigma_j$ denote ith and jth spin values, respectively, $J_{i,j}$ denotes a coupling coefficient between an ith spin and a jth spin, $h_i$ denotes a bias coefficient with respect to the ith spin, and $\sigma$ denotes a spin configuration.

In Equation (1), a first term is for calculating energy resulting from coupling between spins. In general, the Ising model is expressed as an undirected graph, and coupling from the ith spin to the jth spin is not distinguished from coupling from the jth spin to the ith spin. For this reason, in the first term, an influence of a coupling coefficient is calculated for a combination of $\sigma_i$ and $\sigma_j$ satisfying i<j. In addition, a second term is for calculating energy resulting from a bias with respect to each spin.

A search for a ground state of the Ising model corresponds to an optimization problem for obtaining a spin configuration that minimizes the energy function of the Ising model. It has been known that the search for the ground state of the Ising model represented by a nonplanar graph corresponds to NP-hard. In recent years, in order to efficiently solve this problem, an apparatus for searching the ground state by applying a semiconductor device technology has been proposed (Patent Document 1).

CITATION LIST

Patent Document

Patent Document 1: JP 2016-51313 A

Non-Patent Document

Non-Patent Document 1: Isakov, Sergei V., et al. "Optimised simulated annealing for Ising spin glasses." Computer Physics Communications 192 (2015): 265-271.

Non-Patent Document 2: Fischer, Thomas H., Wesley P. Petersen, and Hans Peter Luthi. "A new optimization technique for artificial neural networks applied to prediction of force constants of large molecules." Journal of computational chemistry 16.8 (1995): 923-936.

Non-Patent Document 3: Zuehlsdorff, Tim Joachim. Computing the Optical Properties of Large Systems. Springer, 2015.

SUMMARY OF THE INVENTION

Problems to be Solved by the Invention

In general, a Markov chain Monte Carlo method (hereinafter referred to as MCMC) is used in performing the search for the ground state or sampling of the Ising model. MCMC is a method of estimating a desired statistic by performing state sampling while stochastically transiting between states.

FIG. 1 illustrates a conceptual diagram of an energy landscape of the Ising model. In this figure, a spin configuration is plotted on a horizontal axis, and energy in the spin configuration is plotted on a vertical axis. In a stochastic transition, a transition to a state σ' in the vicinity of a current state σ is repeated. A probability of a transition from the state σ to the state σ' is referred to as a transition probability P(σ,σ'). A metropolis algorithm, a heat-bath algorithm, etc. are known as the transition probability. For example, the transition probability of the metropolis algorithm corresponds to Equation (2) below. T is a parameter generally referred to as temperature, which represents easiness of a transition between states.

[Equation 2]

$$P(\sigma, \sigma') = \min\left\{1, \exp\left(-\frac{H(\sigma') - H(\sigma)}{T}\right)\right\} \quad (2)$$

Equation 2

As a general method of generating the state σ' in the vicinity, a value of one spin is changed from the current state σ. All spins are searched by changing the spins one by one in order. For example, in the case of FIG. 1, when one spin is inverted from state A, state B is obtained. Then, when one spin is further inverted, state C is obtained.

When MCMC is executed while gradually decreasing the parameter T from a large value, asymptotical convergence to a state having lowest energy occurs. Thus, a method of obtaining an optimal, solution or an approximate solution of a minimization problem is known as a simulated annealing method (hereinafter referred to as SA).

When MCMC and SA are applied to the Ising model, the spin value is stochastically determined based on Equation (2). A state transition based on Equation (2) can be simultaneously applied to non-adjacent spins. For this reason, MCMC and SA can be executed at high speed by preparing a plurality of circuits for realizing a stochastic process based on Equation (2) and updating spin values in parallel (see, for example, Patent Document 1).

However, when the stochastic process based on Equation (2) is executed using a logic circuit, calculation of an exponential function or multiplication, generation of a random number, etc. are necessary. A circuit therefor requires a large physical quantity. Therefore, even though it is preferable to arrange a plurality of circuits as described above, when it is presumed that a large-scale apparatus is realized in a limited circuit area, it is difficult to sufficiently provide a circuit based on Equation (2).

Solutions to Problems

An aspect of the invention is an information processing apparatus including one or a plurality of array circuits. In this apparatus, each of the array circuits includes a plurality of units, and each of the plurality of units includes a first memory that stores a value indicating a state of one node of a coupling model, a second memory that stores a coupling coefficient indicating coupling from a node of another unit connected to an unit of the second memory, and a logic circuit that determines a value indicating a subsequent state of the one node based on a value indicating a state of the node of the other unit and the coupling coefficient. Further, the logic circuit sets a first random variable in accordance with an exponential distribution of a parameter θ as an input.

Another aspect of the invention is an information processing method using an information processing apparatus including array circuits. In this method, each of the array circuits of the information processing apparatus includes a plurality of units, and each of the plurality of units includes a first memory that stores a value indicating a state of one node of a coupling model, a second memory that stores a coupling coefficient Indicating coupling from a node of another unit connected to an unit of the second memory, and a logic circuit that determines a value indicating a subsequent state of the one node based on a value indicating a state of the node of the other unit and the coupling coefficient. Here, a process of updating the state of the one node with the subsequent state by the logic circuit is performed on a premise of a schedule in which a reciprocal of a temperature T corresponds to an equal interval c when a parameter indicating easiness of transition of the state of the one node is set to the temperature T, and a first random variable expressed by $-T \cdot \ln(u)$ (where u is a uniform random number greater than 0 and less than 1) is generated by a first random number generator commonly provided to the plurality of units, and supplied by a first signal path passing through the plurality of units in series.

Effects of the Invention

It is possible to perform a stochastic process based on a metropolis algorithm while reducing a physical quantity of a circuit.

MODE FOR CARRYING OUT THE INVENTION

Figure 1:
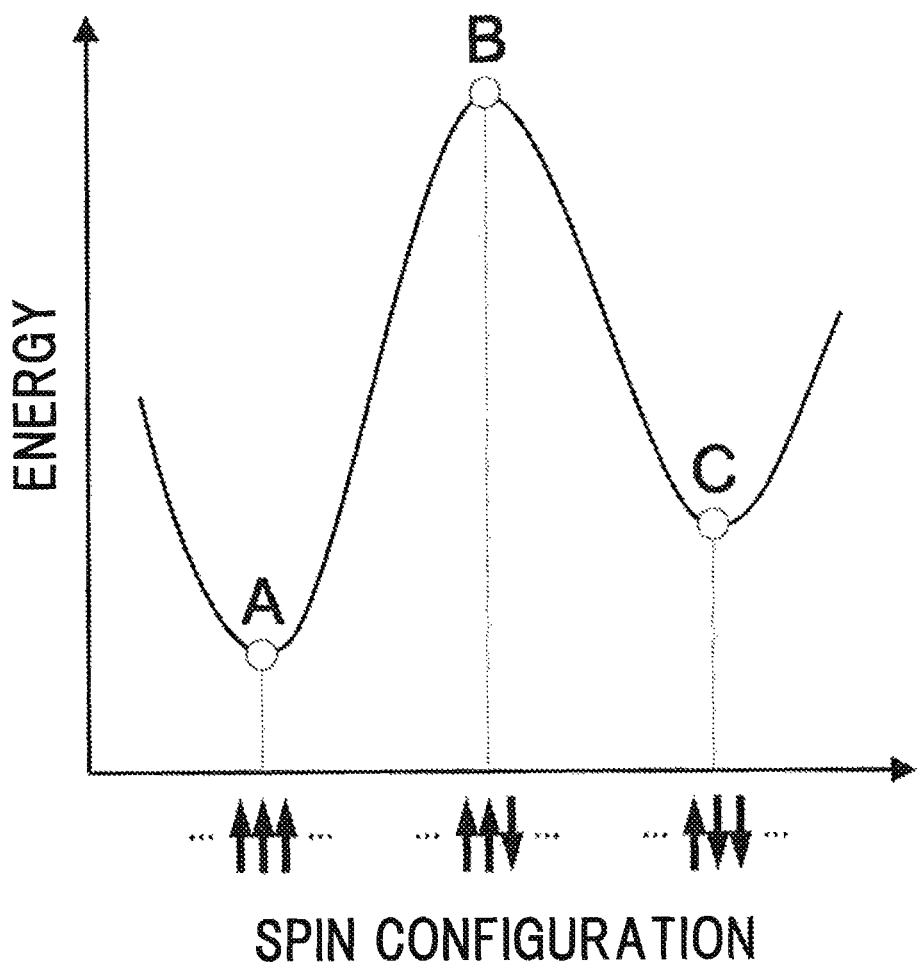
FIG. 1 is a conceptual diagram of an energy landscape of an Ising model.

In embodiments below, for the sake of convenience, as necessary, division into a plurality of sections or embodiments will be performed in description. However, unless otherwise stated, the sections or embodiments are not unrelated to one another, and one of the sections or embodiments corresponds to a modification, a detailed description, a supplementary description, etc. of a part or whole of the other ones. In addition, in embodiments below, when reference is made to the number of elements (including the number, numerical value, amount, range, etc.), the embodiments are not limited to the particular number and a specific number or more or fewer may be employed except for the case of being explicitly stated, the case of being clearly limited to a specific number in principle, etc.

Further, it is clear that a constituent element (including an element step, etc.) is not necessarily indispensable except the case of being particularly stated, the case of being considered to be obviously indispensable in principle, etc. in embodiments below. Similarly, in embodiments below, when shapes, a positional relationship, etc. of constituent elements, etc. are mentioned, except for the case of being particularly stated, the case of being considered to be clearly inappropriate in principle, etc., a substantially approximate or similar shape, etc. is included, which is applied to the numerical value and the range.

Hereinafter, embodiments will be described in detail with reference to drawings. In all the drawings for description of the embodiments, the same numerical symbol or a related numerical symbol may be assigned to the same member in principle, and a repeated description thereof will be omitted. In addition, in embodiments below, except for a particularly necessary case, a description of the same or a similar portion will not be repeated in principle. When a plurality of elements has the same or a similar function, a description may be given by adding different subscripts to the same reference symbol. However, when a plurality of elements may not be distinguished, a description may be given by omitting the subscripts.

Notations such as "first", "second", "third", etc. in this specification, etc. are provided for identifying constituent elements and do not necessarily indicate the number, an order, or contents thereof. In addition, the number for identifying the constituent element is used for each context, and the number used in one context does not necessarily indicate the same constitution in other contexts. In addition, it does not preclude that a constituent element identified by a certain number has a function of a constituent element identified by another number.

In the embodiments, a description will be given of a semiconductor device and an information processing apparatus which can be easily manufactured at a low cost and, for example, can calculate an arbitrary coupling model such as an Ising model, etc. Specifically, a description will be given of the information processing apparatus that has a minimum value function taking a plurality of independent random numbers according to an exponential distribution as an input to perform a stochastic process according to a metropolis algorithm with respect to the coupling model represented by the Ising model.

Embodiment 11

(1) Coupling Model

As described above, various physical phenomena and social phenomena can be represented by coupling models. As a feature of the coupling model, an influence between nodes is limited to coupling between two nodes (coupling between two bodies). As a representative example of a coupling model in the world of physics, the above-mentioned Ising model can be mentioned. In the following, a description will be given of an example of the semiconductor device that performs a search for a ground state or sampling of the Ising model, and the information processing apparatus that controls the semiconductor device as an accelerator.

(2) Ising Model Expanded to Directed Graph

In the present embodiment, a model represented by Equation (3) below, which is an expansion of the Ising model, will be hereinafter referred to as the Ising model.

[Equation 3]

[数3]

$$H(\sigma) = -\sum_{i \neq j} J_{i,j} \sigma_i \sigma_j - \sum_i h_i \sigma_i \quad (3)$$

Equation 3

A difference from the Ising model shown in Equation (1) is that coupling indicated by the directed graph is permitted in Equation (3). In general, the Ising model can be drawn as an undirected graph in graph theory since coupling of the Ising model does not distinguish a coupling coefficient $J_{i,j}$ from an ith spin to a jth spin and a coupling coefficient $J_{j,i}$ from the jth spin to the ith spin.

The present embodiment can be applied even when the Ising model is expanded and $J_{i,j}$ and $J_{j,i}$ are distinguished from each other, and thus an Ising model configured to correspond to a directed graph is treated. When an Ising model corresponding to an undirected graph is treated in an Ising model corresponding to a directed graph, the same coupling coefficient may be simply defined in both directions of $J_{i,j}$ and $J_{j,i}$.

(3) Configuration of Information Processing Apparatus in the Present Embodiment

<<(3-1) Overall Configuration of Information Processing Apparatus Including Semiconductor Device>>

Figure 2:
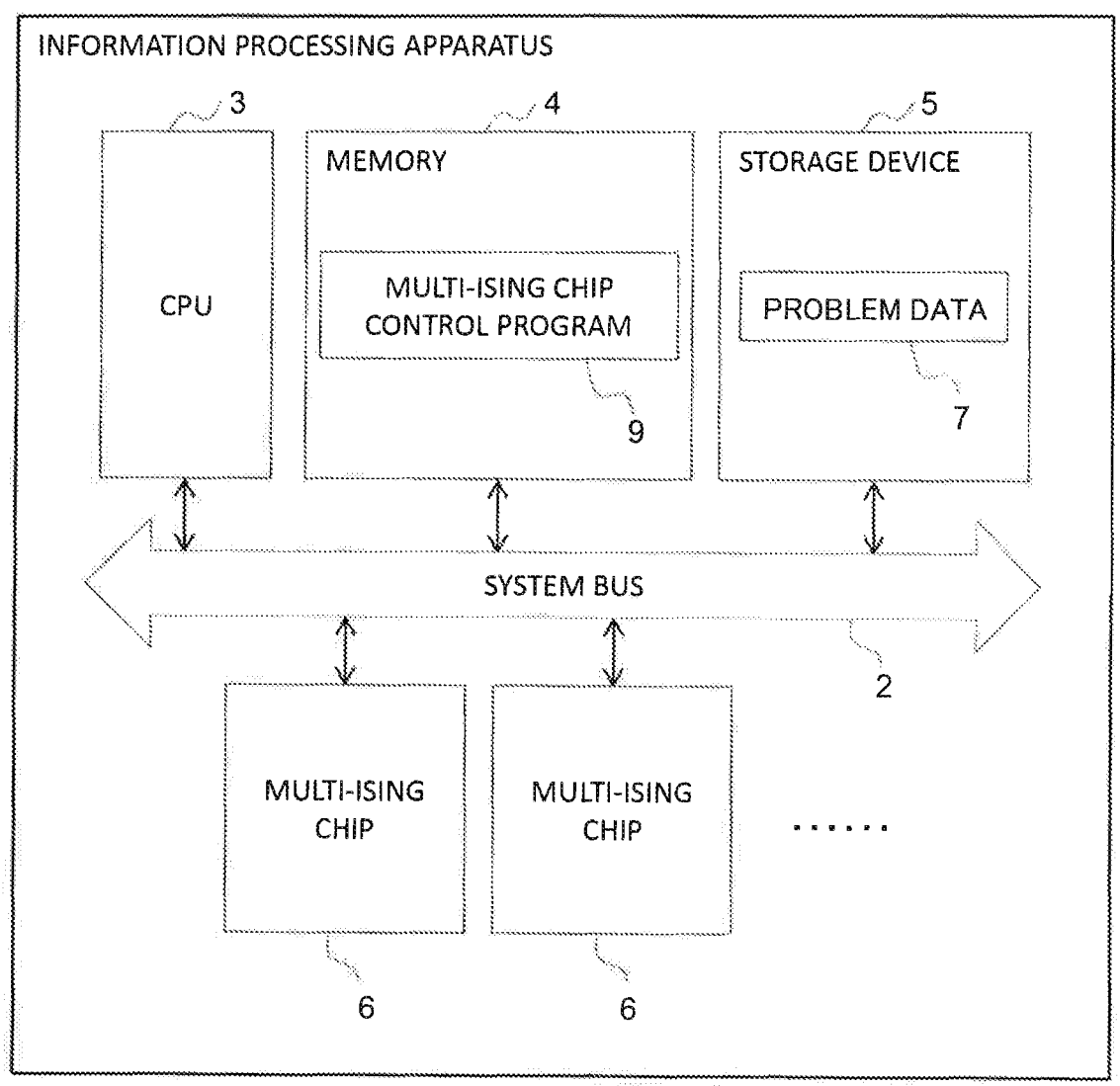
FIG. 2 is a block diagram illustrating an overall configuration of an information processing apparatus including a semiconductor device in an embodiment.
Figure 3:
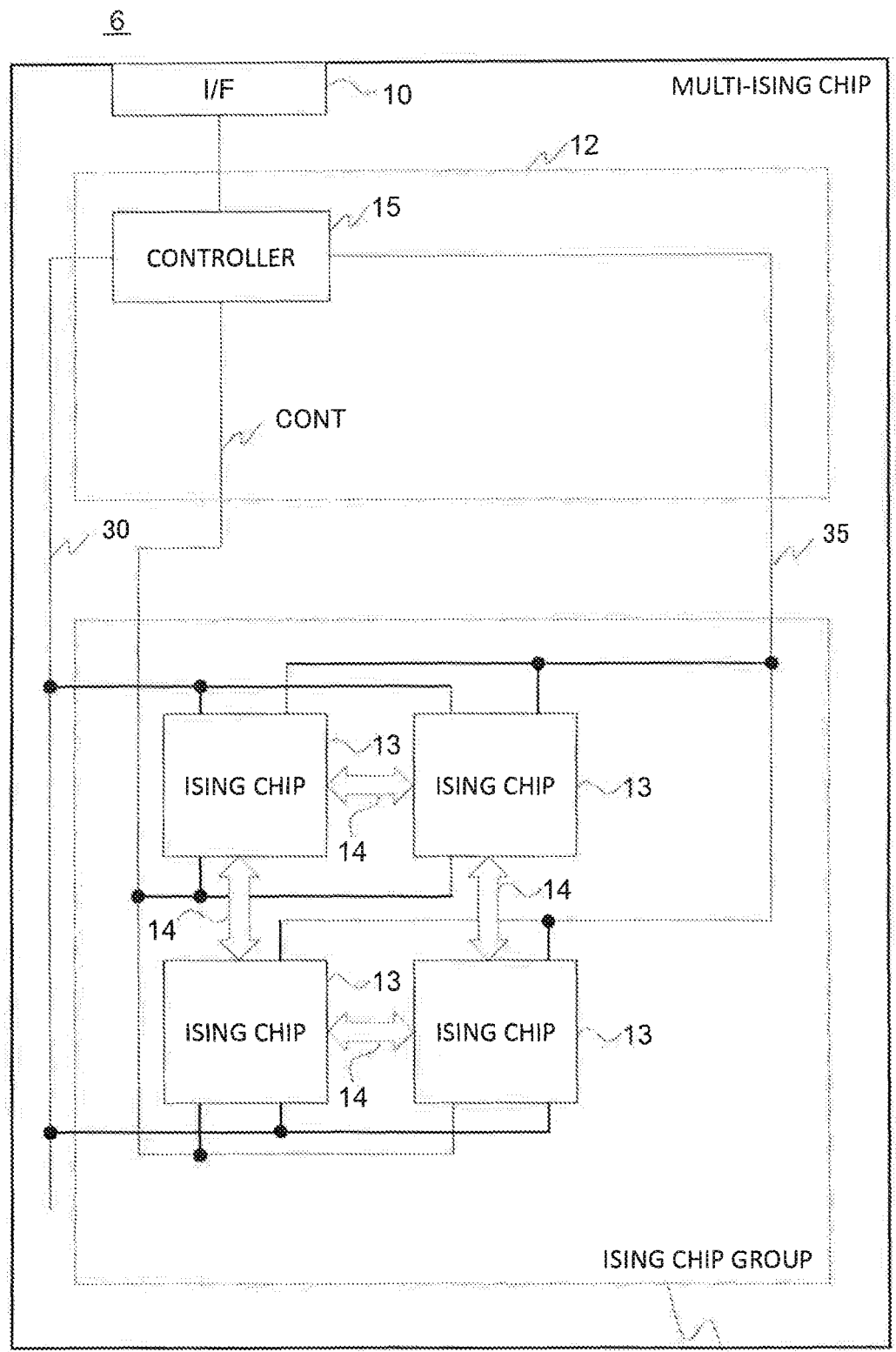
FIG. 3 is a block diagram illustrating an example of a configuration of a multi-Ising chip in the embodiment.

A description will be given of an overall configuration of the information processing apparatus including the semiconductor device with reference to FIG. 2 and FIG. 3. FIG. 2 is a block diagram illustrating an example of an overall configuration of the information processing apparatus including the semiconductor device in the present embodiment. FIG. 3 is a block diagram illustrating an example of a configuration of a multi-Ising chip in the present embodiment.

FIG. 2 illustrates the information processing apparatus according to the present embodiment. The information processing apparatus 1 includes a personal computer, a workstation, a server, etc. and includes a central processing unit (CPU) 3, a memory 4, a storage device 5, and a plurality of multi-Ising chips 6 connected through a system bus 2. Although not illustrated, various input devices and output devices usually provided as the in formation processing apparatus may be provided.

The CPU 3 is a processor that controls an overall operation of the information processing apparatus 1. Further, for example, the memory 4 includes a volatile semiconductor memory, and is used to store various programs, etc. For example, the storage device 5 includes a hard disk device, a solid state drive (SSD), etc., and is used to hold a program or data for a long period.

In the case of the present embodiment, problem data 7 of an Ising model form problem to be solved by the information processing apparatus 1 is stored in the storage device 5, and a multi-Ising chip control program 9 is stored in the memory 4. The multi-Ising chip control program 9 is a program for performing a control operation for solving a problem in each of the multi-Ising chips 6.

A program for converting problem data not having an Ising model, form into the problem data 7 having the Ising model form may be stored in the memory 4. In this way, it is possible to deal with problems not having the Ising model form, so that usefulness of the information processing apparatus 1 can be improved.

The multi-Ising chip 6 is dedicated hardware for performing the search for the ground state of the Ising model, and takes, for example, the form of an expansion card installed in the information processing apparatus 1 such as a graphics processing unit (GPU), which is dedicated hardware for screen rendering processing.

FIG. 3 is a configuration block diagram of the multi-Ising chip. As illustrated in FIG. 3, the multi-Ising chip 6 includes an interface (I/F) 10, an Ising chip group 11, and a controller 12, and exchanges a command or information with the CPU 3 (FIG. 2) through the interface 10 and the system bus 2.

The Ising chip group 11 includes a plurality of Ising chips 13 each of which is dedicated hardware for performing the search for the ground state or sampling of the Ising model. The Ising chips 13 are connected by inter-chip wires 14, and the Ising chips 13 can transmit and receive necessary information via the inter-chip wires 14.

The controller 12 has a function of controlling each Ising chip 13 included in the Ising chip group 11 and includes a controller 15. It is presumed that the controller 15 has a clock generation function for controlling timing.

The controller 15 is a processor that controls an operation of the entire multi-Ising chip 6, and controls an operation or operation timing of each of the Ising chips 13 included in the Ising chip group 11 according to a command given from the CPU 3 (FIG. 2) of the information processing apparatus 1 through the system bus 2 (FIG. 2) and the interface 10. In addition, the controller 15 performs a control operation for storing the problem data 7 transmitted from the storage device 5 in the Ising chip 13 and transmitting solution data read from the Ising chip 13 to the storage device 5.

The controller 15 writes the problem data 7 corresponding to initial value data and reads solution data corresponding to result data using a static random access memory (SRAM) compatible interface 30 with respect to each Ising chip 13. In addition, the controller 15 transmits a control command CONT to each Ising chip 13 to control an operation of the Ising chip 13. In addition, the controller 15 controls coupling calculation with respect to each Ising chip 13 through a coupling control interface 35.

<<(3-2) Configuration of Ising Chip>>

Figure 4:
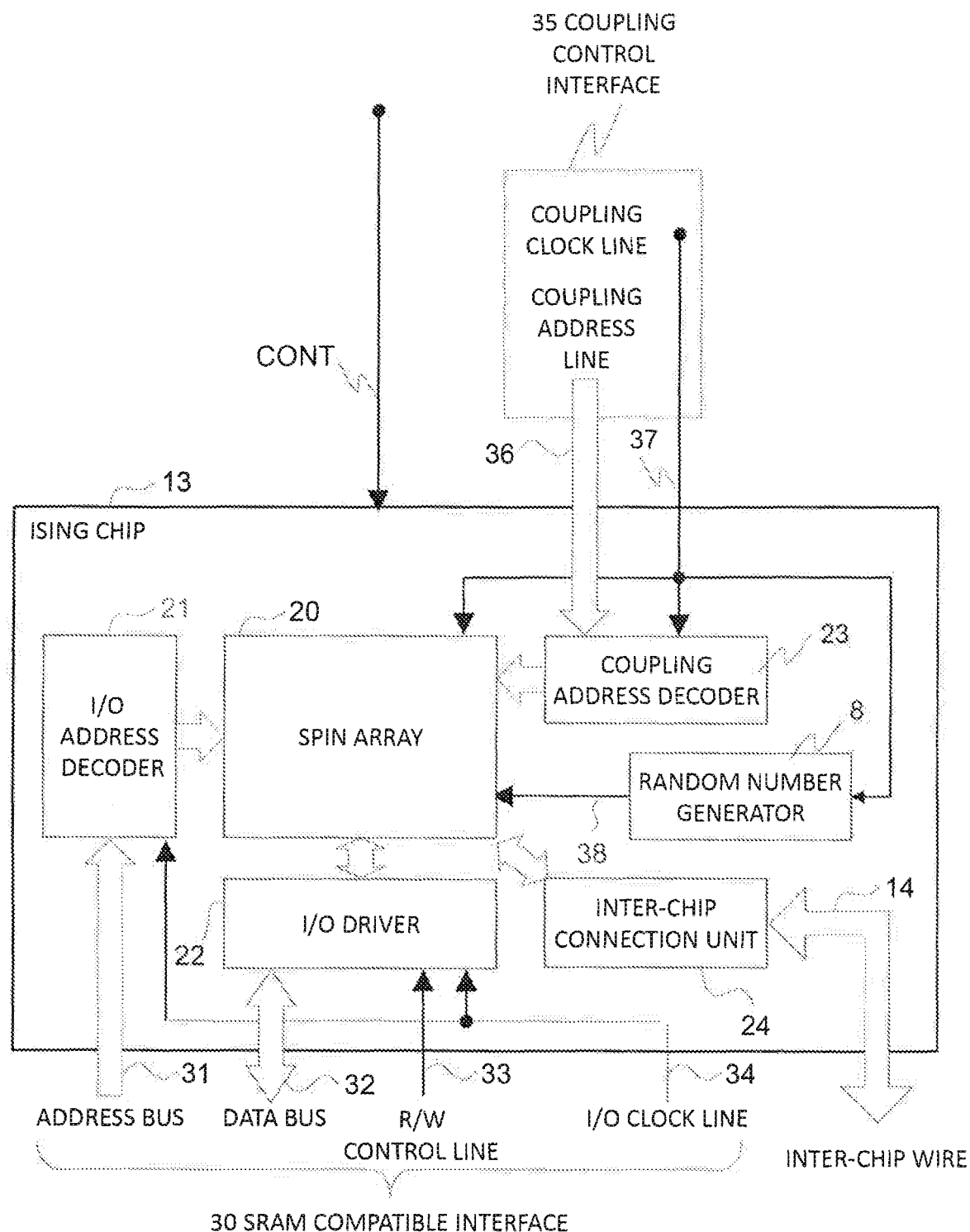
FIG. 4 is a block diagram illustrating an example of a configuration of an Ising chip in the embodiment.

A configuration of the Ising chip 13 will be described with reference to FIG. 4. FIG. 4 is a block diagram illustrating an example of the configuration of the Ising chip 13 in the present embodiment. The Ising chip is a semiconductor integrated circuit that includes a spin array 20 and updates a value of each spin by coupling calculation.

As illustrated in FIG. 4, the Ising chip 13 includes a spin array 20, an input/output (I/O) address decoder 21, an I/O driver 22, a coupling address decoder 23, and an inter-chip connection unit 24. In the present embodiment, a description will be given on the assumption that the Ising chip 13 is mounted as a complementary metal-oxide semiconductor (CMOS) integrated circuit, which is widely used at present. However, other solid elements may also be realized.

The Ising chip 13 includes an address bus 31, a data bus 32, an R/W control line 33, and an I/O clock line 34 as the SRAM compatible interface 30 for performing read/write on a memory cell of the spin array 20. In addition, the Ising chip 13 includes a coupling address line 36 and a coupling clock line 37 as the coupling control interface 35 for controlling the search for the ground state of the Ising model.

In the Ising chip 13, a spin $\sigma_i$, a coupling coefficient $J_{i,j}$, and a bias coefficient $h_i$ of the Ising model are all represented by information stored in the memory cell in the spin array 20. Setting of an initial state of the spin $\sigma_i$ or reading of a spin configuration after performing MCMC is performed through the SRAM compatible interface 30. In addition, in the Ising chip 13, reading/writing of the coupling coefficient $J_{i,j}$ and the bias coefficient $h_i$ for setting the Ising model executing MCMC in the spin array 20 is performed through the SRAM compatible interface 30.

For this reason, addresses are given to the spin $\sigma_i$, the coupling coefficient $J_{i,j}$, and the bias coefficient $h_i$ in the spin array 20. Further, when the spin $\sigma_i$, the coupling coefficient $J_{i,j}$, or the bias coefficient $h_i$ is read/written from/to the Ising chip 13, a corresponding address is given from the controller 15 to the I/O address decoder 21 through the address bus 31, and an R/W control signal for controlling reading/writing of the spin $\sigma_i$, the coupling coefficient $J_{i,j}$, and the bias coefficient $h_i$ is given from the controller 15 to the I/O driver 22 through the R/W control line 33.

Thus, the I/O address decoder 21 activates a word line of the spin array 20 based on an address given via the address bus 31, and the I/O driver 22 drives a corresponding bit line in the spin array 20 based on an R/W control signal given via the R/W control line 33. In this way, an initial value of the spin $\sigma_i$ and set values of the coupling coefficient $J_{i,j}$ and the bias coefficient $h_i$ given through the data bus 32 are set in the spin array 20, or a solution after performing MCMC is read from the spin array 20 and output to the outside via the data bus 32.

The address bus 31, the data bus 32, and the R/W control line 33 included in the SRAM compatible interface 30 are synchronized with the I/O clock supplied from the controller 12 to the Ising chip 13 via the I/O clock line 34.

In addition, the Ising chip 13 realizes coupling between spins inside the spin array 20 in order to perform MCMC. It is the coupling control interface 35 that externally controls this coupling. The Ising chip 13 inputs an address designating a spin group performing coupling given from the controller 15 via the coupling address line 36. In addition, similarly, a coupling clock provided from the controller 15 is input from the coupling clock line 37, and coupling is performed in synchronization therewith. The coupling address decoder 23 reads or writes the spin value, the coupling coefficient $J_{i,j}$, and the bias coefficient $h_i$ with respect to the spin array 20 based on the address given via the coupling address line 36.

The coupling address line 36 and the coupling clock line 37 designate update timing of a spin unit to be updated so that spins of adjacent spin units are not simultaneously updated in the Ising chip 13. A reason therefor is that when the spins of the adjacent spin units are simultaneously updated, both updates are overlapped, and vibration occurs without energy being allowed to be minimized.

The Ising chip 13 is used for calculation together with the data read from the memory in the spin array 20, and thus has a random number generator 8 and a random number signal line for injecting a random number as described below. The random number generated by the random number generator 8 is given to the spin array 20 via this random number signal line. A configuration of the random number generator 8 and a method of supplying random numbers to the spin array 20 will be described below in detail.

When the plurality of Ising chips 13 are cooperatively operated, the inter-chip connection unit 24 functions as an interface at the time of transmitting and receiving a value of a necessary spin a between Ising chips 13 arranged adjacent to each other or as a path of random numbers. The control signal CONT may include signal lines EN and SW of switching signals to be described below, and include other necessary control signals.

The spin array 20, the SPAM compatible interface 30, and the coupling control interface 35 described above can basically be configured similarly to those disclosed in Patent Document 1, except for portions specifically described in this specification.

<<(3-3) Configuration of Spin Array>>

Figure 5:
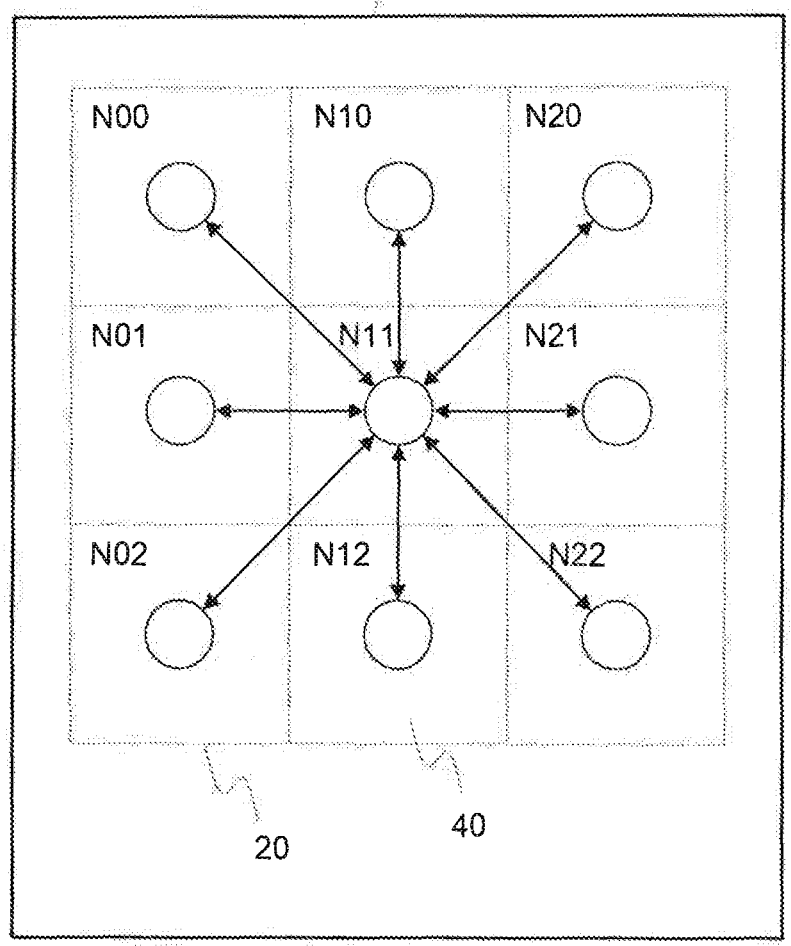
FIG. 5 is a conceptual diagram for description of an example of a configuration of a spin array of a 2-dimensional lattice in the embodiment.
Figure 5:

FIG. 5 is a conceptual diagram for schematically describing a spin array in the form of a king graph and a connection relation thereof. Even though the invention can be applied to a graph other than the king graph, the king graph will be described as an example in the present embodiment. The spin array 20 has, as a basic structural unit, a spin unit 40 including a memory that holds one spin $\sigma_i$ and a coupling coefficient $J_{i,j}$ and a bias coefficient $\sigma_i$ associated therewith and an arithmetic circuit for realizing MCMC, and has a configuration in which a plurality of spin units 40 is arranged side by side.

Figure 6:
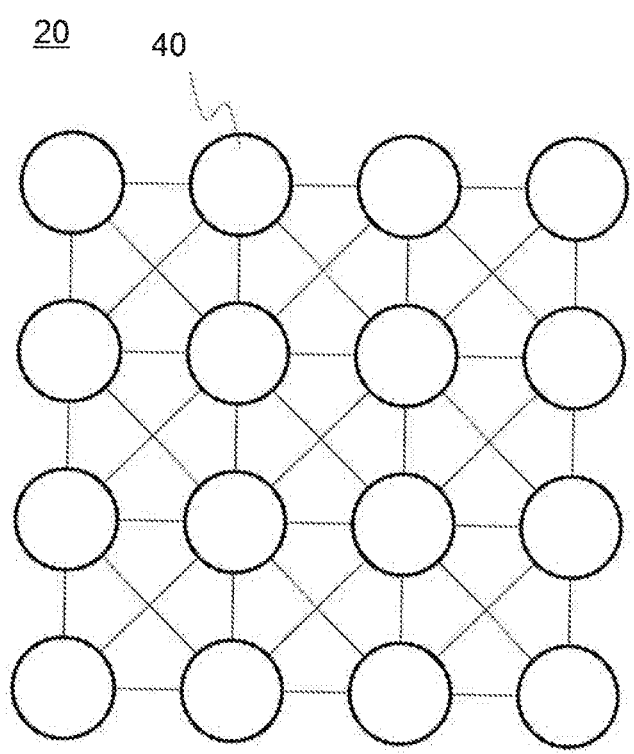
FIG. 6 is a circuit diagram illustrating an example of a configuration of a spin unit in the embodiment.

FIG. 6 illustrates a concept of the king graph. The king graph is a graph in which diagonal lines are added to a grid graph as illustrated in FIG. 6.

In FIG. 5, the spin array 20 has nine spin units 40 of 3×3, and a spin of the spin unit 40 is indicated by a circle. The spin array 20 is realized by one Ising chip 13. A spin value of another spin unit is input to one spin unit 40. In FIG. 5, it is presumed that spin values of eight spin units are input. For the sake of convenience, a spin unit for inputting a spin value to a certain spin unit will be referred to as an "adjacent spin unit (adjacent node)". However, this description does not necessarily mean that the spin units are adjacently arranged physically or geometrically.

The spin unit 40 has a memory cell for holding a spin value. Referring to the spin value, for example, an upper/lower value of a spin is expressed by HIGH/LOW. In FIG. 5, paying attention to a central spin unit $N_{11}$ of each spin array 20, input and output of spin values are indicated by arrows. In addition, the spin unit 40 has a memory cell for holding a bias coefficient $h_i$ and a coupling coefficient $J_{i,j}$ with respect to the adjacent spin unit in addition to the spin value. For example, a configuration of the spin array 20 that performs such coupling is described in Patent Document 1, and a configuration other than that specifically noted in the present embodiment may be configured accordingly.

In FIG. 5, a position of the spin unit is indicated by a position in a horizontal direction and a vertical direction such as Nxy. The spin array 20 is realized by arranging the spin unit 40 in a tile shape.

<<(3-4) Configuration of Spin Unit>>

Figure 7:
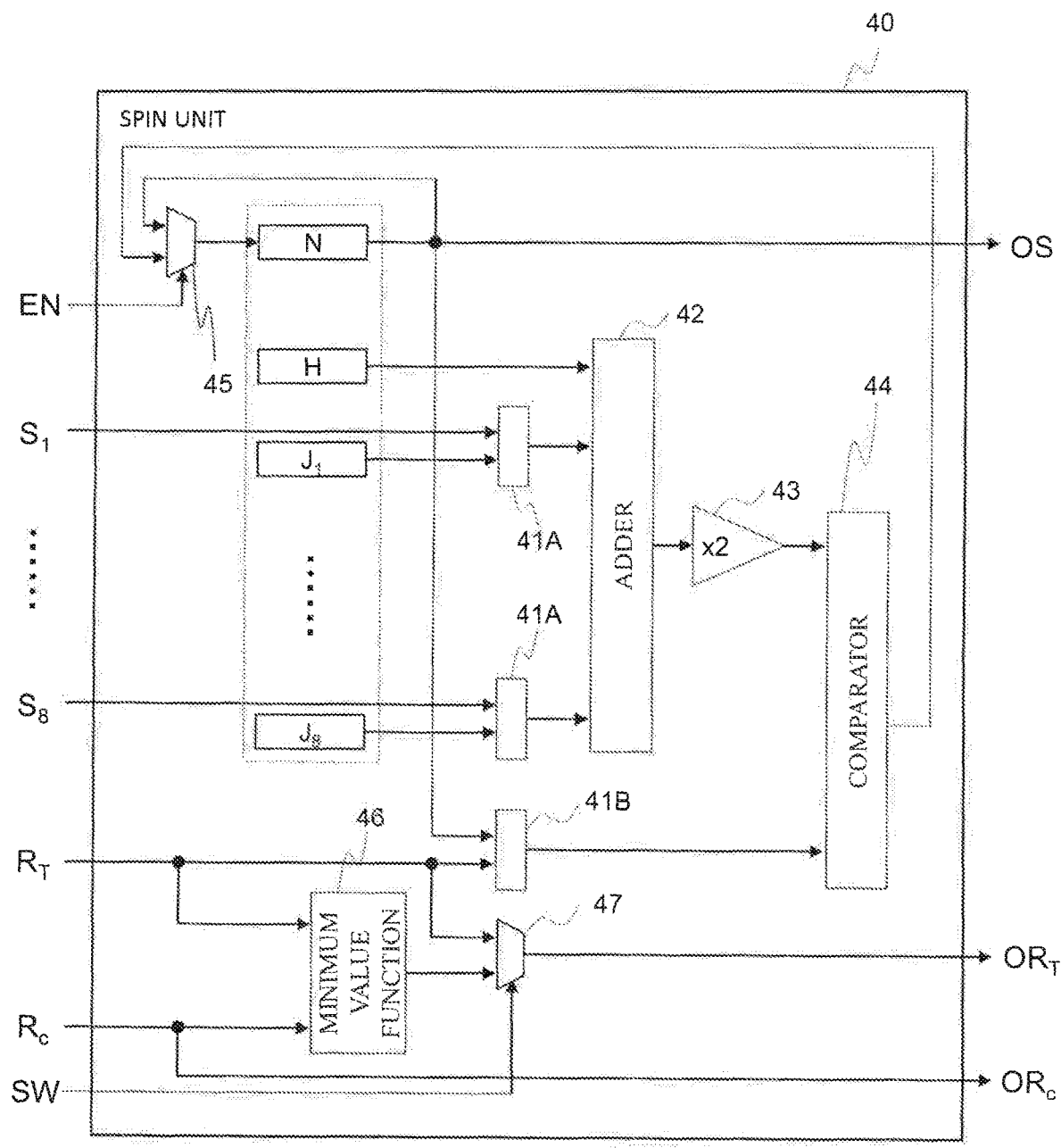
FIG. 7 is a block diagram illustrating a configuration of a spin unit.

FIG. 7 is a circuit block diagram illustrating an example of a configuration of the spin unit 40 in the present embodiment. One spin unit corresponds to one node of the Ising model. Although not illustrated, a bit line and a word line, which are interfaces for accessing from the outside of the Ising chip 13, are arranged in the memory cell of the spin unit 40, and read/write timing is controlled, which follows a control scheme of a conventional semiconductor memory and is realized by the SRAM compatible interface 30 described above.

The configuration of the spin unit 40 will be described with reference to FIG. 7. The memory cell N is a memory cell for expressing a spin and holds a spin value. In the Ising model, the spin value is +1/−1 (+1 is expressed by up and −1 is expressed by down), which corresponds to binary 0/1 that can be held by the memory cell. For example, +1 corresponds to 1, and −1 corresponds to 0.

In a case in which the Ising model is regarded as a directed graph, when viewed from a certain spin, another spin has a coefficient of an influence on the self spin. A coefficient of an influence of the self spin on the other spin belongs to the other spin.

In examples of FIGS. 5 and 6, the spin unit 40 is connected to a maximum of eight spin units. That is, $N_{11}$ of FIG. 5 obtains values $S_1$ to $S_8$ of spins from eight spin units $N_{00}$, $N_{11}$, $N_{20}$, $N_{01}$, $N_{21}$, $N_{02}$, $N_{12}$, and $N_{22}$, and transmits a value stored in a memory cell N thereof to the spin units. The number of connected spin units may be more or fewer than eight without being limited to the above example.

In the case of FIG. 7, the spin unit 40 includes eight sets of memory cells storing coupling coefficients $J_1$ to $J_8$ indicating an influence on the self spin. Furthermore, the spin unit 40 has a memory cell H storing a bias coefficient h. In the Ising chip 13 of the present embodiment, the bias coefficient h and the coupling coefficients $J_1$ to $J_8$ are made to correspond to M-bit values, respectively. Therefore, in order to express the bias coefficient and the coupling coefficient, an M-bit memory cell is required.

Each of the memory cell N and memory cells H and $J_k$ (1≤k≤8) in the spin unit 40 needs to be able to perform reading/writing from the outside of the Ising chip 13. For this reason, as described above, the spin unit 40 has each of a bit line and a word line (not illustrated in FIG. 7). In the Ising chip 13, the spin units 40 are arranged in a tile pattern on a semiconductor substrate so that a bit line and a word line are connected thereto, and the memory cells in the spin units 40 can be read/written using the SRAM compatible interface 30 of the Ising chip 13 similarly to a general SRAM by driving, controlling, or reading the spin units 40 using the I/O address decoder 21 and the I/O driver 22.

In the Ising chip 13, after problem data is stored in a memory using the SRAM compatible interface 30, coupling calculation is performed, a value of the memory is updated, a solution is searched, and an obtained solution is read by the SPAM compatible interface 30. Specifically, the coupling calculation executed here corresponds to MCMC (the search for the ground state, the sampling, etc.) based on the metropolis algorithm for the Ising model. Hereinafter, a description will be given of a circuit for updating the spin value of the memory by performing the coupling calculation. In the present embodiment, a description will be given of an example of enabling the search for the ground state while reducing a circuit scale. In this instance, it is presumed that a temperature schedule is set to a schedule equally spaced by a reverse temperature (a reciprocal of temperature) (expressed by Equation (12) below).

In FIG. 7, a 1-bit multiplier 41A receives a 1-bit signal indicating values $S_1$ to $S_8$ of adjacent spins and an M-bit signal having coefficients $J_1$ to $J_8$ and outputs the M-bit signal without change or after sign inversion in accordance with a value of the 1-bit signal. A 1-bit multiplier 41B receives a 1-bit signal indicating a value of a self spin and a random number Pr, and outputs the random number $R_T$ without change or after sign inversion in accordance with a value of the 1-bit signal. An adder 42 calculates a sum of output values of a plurality of 1-bit multipliers 41A and the bias coefficient h received from the memory cell H. This value is doubled by an arithmetic unit 43. The doubled signal is input to a comparator 44.

The comparator 44 compares a magnitude relation between the arithmetic unit 43 and the 1-bit multiplier 41B. When an output value of the arithmetic unit 43 is equal to or larger than an output value of the 1-bit multiplier 41B, the comparator outputs 1. In addition, when an output value of the arithmetic unit 43 is less than an output value of the 1-bit multiplier 41B, the comparator outputs 0. An output of the comparator 44 is connected to one input of a selector 45, and an output of the memory cell N is connected to the other input of the selector 45. A signal line EN of a switching signal for permitting the spin of the spin unit 40 to be updated is connected to the selector 45. The output of the selector 45 is connected to the input of the memory cell N. The output of this memory cell N is connected to a signal line OS which outputs a value of the spin of the spin unit 40 to another spin unit 40. The switching signal of the signal line EN is controlled by the aforementioned coupling control interface 35.

A reason why the state transition based on the metropolis algorithm can be realized by the circuit of FIG. 7 will be described using equations below. When the spin expressed by the spin unit 40 is inverted from the current value $\sigma_i$, energy increases by ΔH calculated by the following equation.

[Equation 4]

$$\Delta H = 2\sigma_i \left( h_i + \sum_k J_{ik}\sigma_k \right) \quad (4)$$

Equation 4

In the metropolis algorithm, an acceptance probability (transition probability) of the state transition at a temperature T is expressed by Equation (2). Therefore, when a uniform random number u greater than 0 and less than or equal to 1 is used, a condition under which a state transition is accepted is as follows.

[Equation 5]

$$\Delta H \leq -T \cdot \ln u \quad (5)$$

Equation 5

Here, a case in which the spin becomes $\sigma_i = +1$ after state transition is considered. When a value before transition is +1, the condition is satisfied in a case in which $\Delta H > -T \cdot \ln(u)$, that is, an inequality below holds.

[Equation 6]

$$h_i + \sum_k J_{ik}\sigma_k > -\frac{T \cdot \ln u}{2} \quad (6)$$

Equation 6

Similarly, when a value before transition is −1, a spin after state transition becomes $\sigma_i = +1$ in a case in which $\Delta H \leq -T \cdot \ln(u)$, that is, an inequality below holds.

[Equation 7]

$$h_i + \sum_k J_{ik}\sigma_k \geq -\frac{T \cdot \ln u}{2} \quad (7)$$

Equation 7

Therefore, when an inequality below is satisfied regardless of the value of the spin $\sigma_i$ before transition, the spin becomes $\sigma_i = +1$ after transition.

[Equation 8]

$$h_i + \sum_k J_{ik}\sigma_k \geq \sigma_i \frac{-T \cdot \ln u}{2} \quad (8)$$

Equation 8

Therefore, in order to execute state transition according to the metropolis algorithm, the value of the memory cell N representing a subsequent state of the spin $\sigma_i$ may be given based on Equation (9). However, sign(x) is a function that returns +1 when x≥0 and −1 when x<0.

[Equation 9]

$$\sigma_i \leftarrow \mathrm{sign}\left( 2\left( h_i + \sum_k J_{ik}\sigma_k \right) - \sigma_i \cdot T \cdot \ln u \right) \quad (9)$$

Equation 9

As described above, in order to execute state transition according to the metropolis algorithm, a circuit capable of performing calculation of Equation (9) may be prepared. In the spin array 20, it is necessary for each spin unit 40 to perform parallel calculation based on Equation (9) in order to speed up processing. In this instance, performing generation of the uniform random number u, calculation of a nonlinear function ln, multiplication of the temperature T and ln(u), etc. in the respective spin units 40 causes an increase in circuit scale and a decrease in operating frequency, and thus is not preferable. Hereinafter, a method of realizing Equation (4) while avoiding this problem will be described with reference to FIGS. 7 and 8. In the present embodiment, the arithmetic circuit takes predetermined signals $R_T$ and $R_c$ as inputs, thereby suppressing the circuit scale of the semiconductor device.

In Equation (9), a random variable $-T \cdot \ln(u)$ conforms to an exponential distribution of a parameter 1/T. In general, however, an exponential distribution of a parameter θ is a distribution having the following probability density function.

[Equation 10]

$$f(x) = \begin{cases} \theta e^{-\theta x} & (x \geq 0) \\ 0 & (x < 0) \end{cases} \quad (10)$$

Equation 10

At time k, the signals $R_T$ and $R_c$ have values in accordance with exponential distributions of a parameter $1/T_k$ and a parameter c in each spin unit 40, respectively. That is, in Equation (10), $\theta = 1/T_k$ and $\theta = c$ are set, respectively. For this reason, at the time of generating a random number in accordance with an exponential distribution using the random number generator, a control operation is performed to satisfy this premise. It should be noted that the signal $R_T$ may not be the same in each spin unit. Only parameters representing a property of a probability distribution are the same, which applies to the signal $R_c$. $T_k$ represents a temperature to be used at a k-th time in annealing. In a case in which the temperature is linearly decreased temporally, k is synonymous with elapsed time. "c" denotes an interval of an inverse number of the temperature $T_k$ during annealing. These values are set as parameters by a user before a start of annealing.

A correspondence between Equation (9) and the arithmetic circuit of FIG. 7 is shown from a left side of the equation. An operation "sign" is executed by the comparator 44. "Multiplication by 2" is executed by the arithmetic unit 43. "$h_i$" of "$h_i + \Sigma j_{ik}\sigma_k$" corresponds to a bias coefficient with respect to an ith spin (self spin) stored in the memory cell H. An operation Σ is executed by the adder 42. $j_{ik}$ is a coupling coefficient between a self spin (ith) and an adjacent spin (kth), which is stored in memories $J_1$ to $J_8$. $\sigma_k$ is a value of an adjacent spin and is input from the signal lines $s_1$ to $s_a$.

σ_i is a value of the self spin stored in the memory cell N. −T·ln(u) is a random variable in accordance with the exponential distribution of parameter 1/T and is given by the input signal $R_T$.

In this way, two inputs of the comparator 44 correspond to $2(h_i+\Sigma j_{ik}\sigma_k)$ and $-\sigma_i \cdot T_k \cdot \ln(u)$, respectively. Therefore, in view of Equation (9), a value σ_i stochastically determined based on the metropolis algorithm at the temperature $T_k$ is stored in the memory cell N as a subsequent state.

The temperature $T_k$ and the constant c correspond to parameters given by the user. In annealing of the present embodiment, a temperature sequence shown in Equation (12) is used. This sequence indicates a schedule in which a temperature schedule is equal interval c at an inverse temperature. The temperature $T_k$ and the constant c are determined by the schedule. However, the user sets and inputs an initial value T of temperature and the constant c prior to the start of annealing. For random numbers in the spin unit, an exponential random number having parameters corresponding to nature and $T_1, T_2, \ldots$ appears due to a function of a minimum value function to be described below. In Equation (12), when c=0, $T_1=T_2=\ldots=T_k$. In this case, Equation (12) represents a schedule of constant temperature.

Random number lines $OR_T$ and $OR_c$ output from the spin unit 40 are used as random number lines $R_T$ and $R_c$, respectively in another spin unit 40.

Figure 8:
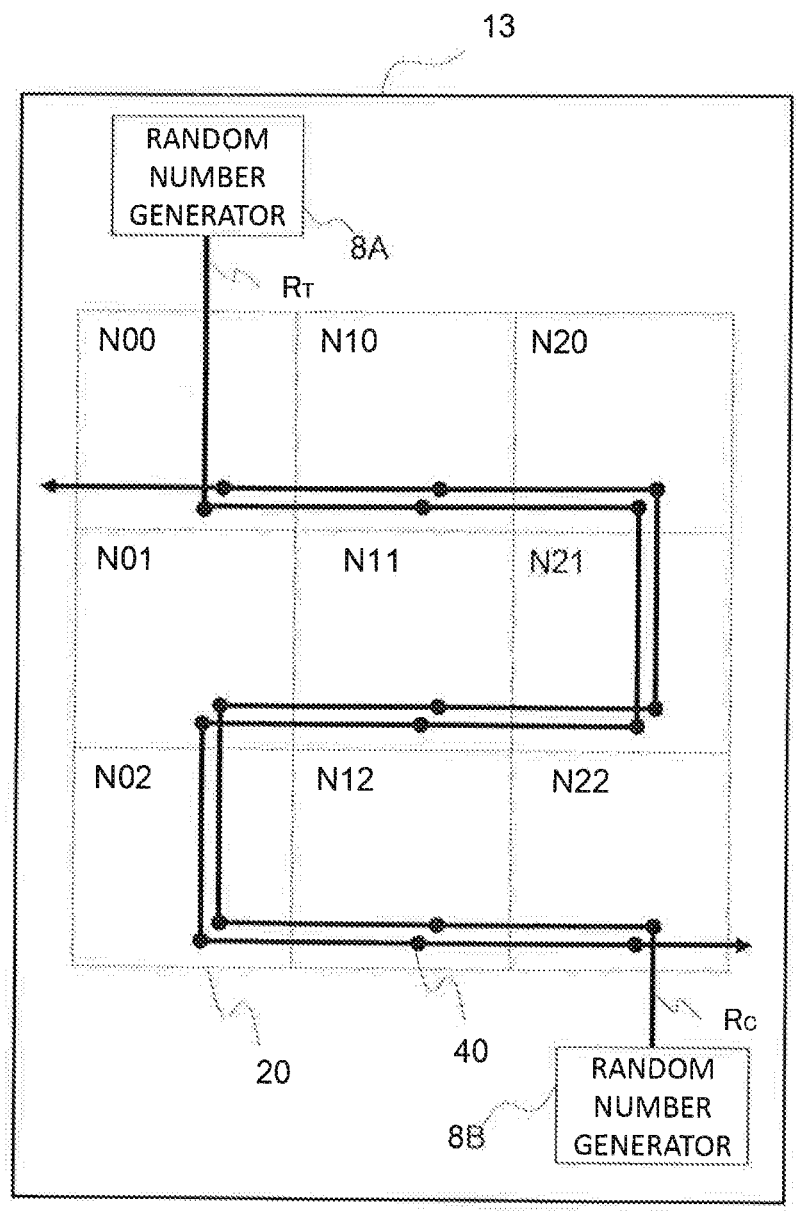
FIG. 8 is a conceptual diagram illustrating a method of supplying a random number to the spin unit.

FIG. 8 illustrates a connection relation between a random number line and a spin unit in the Ising chip 13. The Ising chip 13 has two random number generators 8A and 8B as the random number generator 8, and the respective random number generators independently generate random variables in accordance with exponential distributions. Here, the random number generator 8A supplies a random variable in accordance with an exponential distribution of 1/T to the random number line $R_T$, and the random number generator 8B supplies a random variable in accordance with an exponential distribution of c to the random number line $R_c$. An establishment variable takes a nonnegative value (nonnegative value). Then, signals generated by the respective random number generators flow through the respective spin units 40 in order via the random number lines $P_T$ and $R_c$. Propagation directions of the respective random numbers are determined to be opposite to each other. For example, the signal $OR_c$ of $N_{11}$ is supplied to the signal $R_T$ of $N_{11}$ and the signal $OR_c$ of $N_{11}$ is supplied to the signal $R_c$ of $N_{01}$ at subsequent timing.

From Equation (10), an exponent random number according to the parameter θ is obtained by −ln(u)/θ. Here, u is a uniform random number from 0 to 1. Therefore, in the random number generators 8A and 8B, a uniform random number u is generated by a linear feedback shift register (LFSR), etc. and a logarithm is taken to obtain a random variable according to an exponential distribution.

In Equation (10), it is presumed that the random variables $X_1$ and $X_2$ are in accordance with the exponential distributions of parameters $\theta_1$ and $\theta_2$, respectively. In the case of being independent from each other, a probability that $X_1$ and $X_2$ are larger than x is expressed by Equation (11). An event in which $X_1$ and $X_2$ are larger than x is equivalent to an event in which the minimum value of $X_1$ and $X_1$ is larger than x, and an occurrence probability of this event can be expressed by Equation (10). That is, the minimum value of $X_1$ and $X_2$ is in accordance with an exponential distribution of a parameter $\theta_1+\theta_2$. It should be noted that a symbol Pr means a probability that an event occurs.

[Equation 11]

$$Pr((X_1 > x) \cap (X_2 > x)) = Pr(X_1 > x)Pr(X_2 > x) = e^{-(\theta_1+\theta_2)x} \quad (11)$$

Equation 11

Therefore, when $R_T$ and $R_c$ are set as described above, the minimum value function 46 outputs a random variable according to an exponential distribution of a parameter $1/T_k+c$. This value or a value held by the signal $R_T$ is selected by the selector 47 and applied to the signal $OR_T$. This switching is controlled by the signal line SW. In addition, the signal line $OR_c$ outputs a value of the random number line $R_c$ without change. The signal line SW is included in the control signal CONT supplied from the controller 15. The signal line SW is a signal given from the controller 15 to the respective spin units in common. SW is used to determine whether to change or maintain the temperature T in executing the state transition. In other words, outputting $R_T$ without change as $OR_T$ indicates that the temperature has not changed. In addition, outputting the output of the minimum value function 46 as $OP_T$ means that the temperature changes (for example, $T_k \rightarrow T_{k+1}$), which is controlled by switching the selector 47. A scheme of controlling the signal of the signal line SW that controls the selector 47 depends on a scheme of controlling the temperature in annealing. Therefore, even though a program of the signal of the signal line SW is set prior to the start of annealing, it is presumed that the user inputs the program in advance. In addition, the user may set the number of times of change of the temperature T.

It is desirable that the random numbers $R_T$ used in each spin unit are spatially and temporally independent from each other. When the propagation directions are the same, min $(R_T, R_c)$=min $(OR_T, R_c)$ which is the output of the minimum value function 46 is obtained, and a random number used in a certain spin unit is used in a subsequent spin unit (adjacent spin unit) without change. In order to avoid such a situation, in the present embodiment, as illustrated in FIG. 8, the propagation directions of the two random numbers are opposite to each other. However, since it is sufficient that information items on the two random number lines $R_T$ and $R_c$ are mixed without passing through the same path, the directions may not be opposite to each other. For example, it is possible to consider a scheme of wiring random number lines by rotating the random number lines by 90 degrees, etc.

It is presumed that the output of the minimum value function 46 is given to the $OP_T$ by controlling the signal line SW. As described above, at time k, the signals $R_T$ and $R_c$ have probability random numbers according to exponential distributions of the parameter $1/T_k$ and the parameter c within each spin unit 40. For this reason, at time k+1, which is subsequent timing, the signals $R_T$ and $R_c$ have probability random numbers according to exponential distributions of the parameter $1/T_k+c$ and the parameter c within each spin unit 40. Therefore, at time k+1, spin updating based on the metropolis algorithm is executed using the temperature $T_{k+1}$ given by Equation (12).

[Equation 12]

$$\frac{1}{T_{k+1}} = \frac{1}{T_k} + c \quad (12)$$

Equation 12

The operations in the spin unit 40 described above are performed in parallel. As a result, $OR_T$ changes as long as $OR_T$ is not fixed by the control signal SW, which corresponds to the fact that the transition probability changes as the temperature T changes in annealing. In addition, the spin value σ of each spin unit 40 is calculated each time, and whether to update the value Is determined by the control signal EN.

As described in Non-Patent Documents 1 and 2, temperature scheduling based on Equation (12) is commonly used in the 8A method. According to the present embodiment, in realizing the general-purpose temperature control method, calculation of multiplication and a nonlinear function is maintained only in the random number generator 8, and allowed to be realized only by the minimum value function 46 and the adder 42 in a parallel calculation unit (the spin unit 40 in this embodiment). That is, in the random number generator 8, generation of a uniform random number u, a log function for receiving a uniform random number, and processing for multiplying the value by 1/θ are performed in common with the subordinate spin unit 40. The spin unit 40 can perform processing by a configuration having a small circuit scale such as the minimum value function 46, the adder 42, the comparator 44, etc. in parallel.

Embodiment 21

In FIG. 7, when the signal line SW is controlled so that the selector 47 selects the signal $R_T$ at all times, a metropolis algorithm having constant temperature can be executed. This process is a process necessary for statistical calculation required for algorithms such as Boltzmann machine learning and reinforcement learning based on free energy, and the present embodiment is suitable for this use.

In addition, realizing the state transition based on the metropolis algorithm on the Ising model under constant temperature is useful for executing simulated quantum annealing (hereinafter referred to as SQA). Hereinafter, an embodiment suitable for execution of SQA will be described.

SQA based on a path integral Monte Carlo method considers a Hamiltonian $H_q$ of Equation (13). However, six $\sigma_i^x$ and $\sigma_i^z$ represent an x component and a z component of a Pauli matrix, respectively. In addition, Γ(t) represents the magnitude of a transverse magnetic field and becomes asymptotically small to 0 as the annealing progresses.

[Equation 13]

$$H_q(\sigma) = -\sum_{i<j} J_{ij} \sigma_i^z \sigma_j^z - \sum_i h_i \sigma_i^z - \Gamma(t) \sum_i \sigma_i^x \quad (13)$$

Equation 13

It has been known that dynamics of Equation (13) is spuriously reproduced by Equation (14) by applying Suzuki-Trotter decomposition to Equation (13) (Non-Patent Document 3). As the replica number L increases, a difference between the distribution functions represented by Equation (13) and Equation (14), respectively, decreases. Equation (14) is a classic Ising model and can be calculated using a digital circuit. The number of replicas L and Γ(t) are given by user-defined constants and functions.

[Equation 14]

$$H_c(\sigma) = -\sum_{k=1}^{L} \left( \sum_{i<j} \frac{J_{ij}}{L} \sigma_{i,k} \sigma_{j,k} + \sum_i \frac{h_i}{L} \sigma_{i,k} + \frac{T}{2} \ln\coth\frac{\Gamma(t)}{LT} \sum_i \sigma_{i,k} \sigma_{i,k+1} \right) \quad (14)$$

Equation 14

Equation (14) can be interpreted as extending Equation (1) and introducing the number of replicas L and coupling W between replicas (corresponding to the coefficient of the third term in parentheses). Similarly to Embodiment 1, a similar configuration can be applied to this process.

Figure 9:
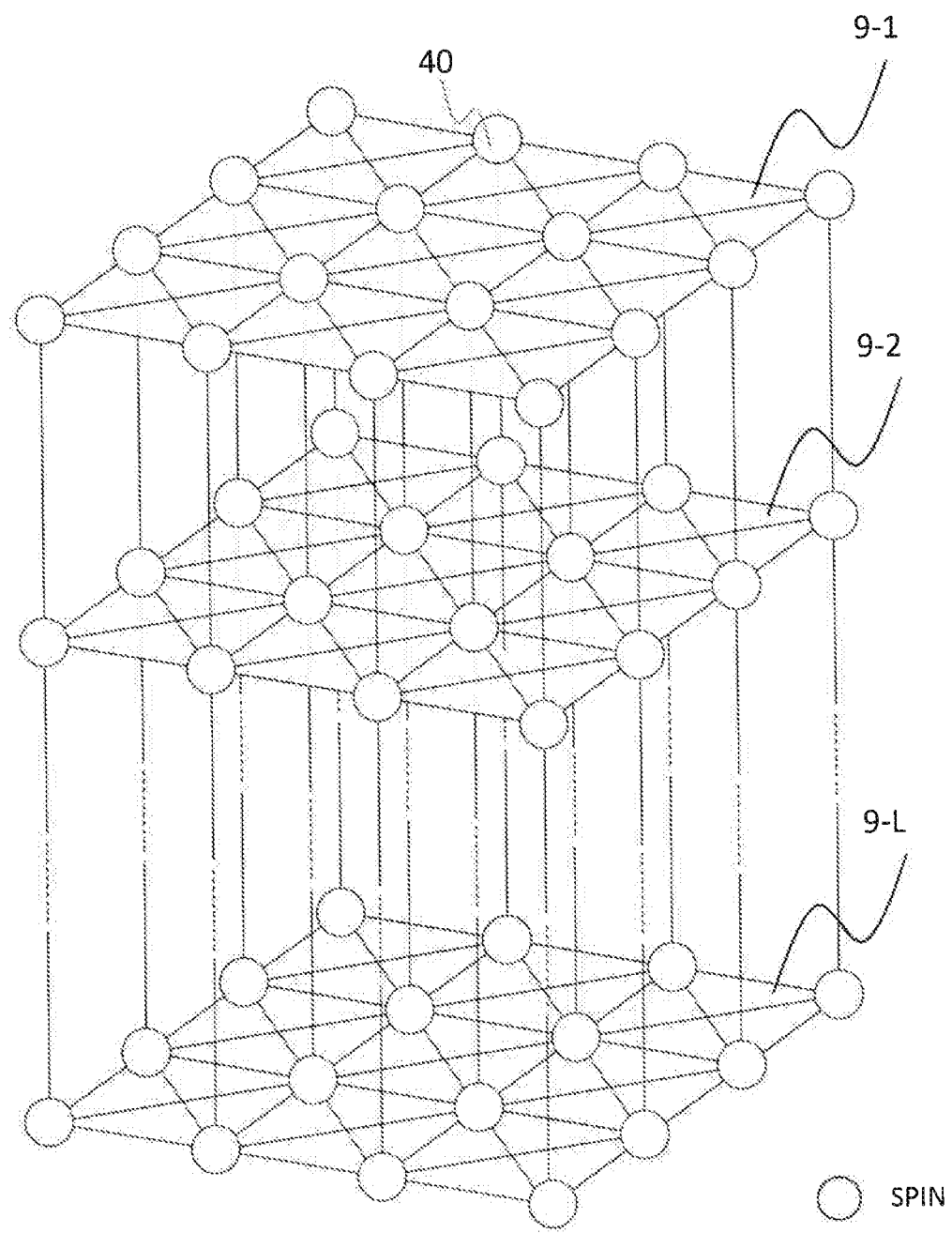
FIG. 9 is a conceptual diagram of an Ising model having a shape in which king graphs are stacked in a height direction.

FIG. 9 is a conceptual diagram of state transition for executing SQA on the Ising model in the form of the king graph illustrated in FIG. 6. As illustrated in FIG. 9, state transition based on the metropolis algorithm may be performed on an Ising model having a shape in which king graphs as many as the number of replicas L are stacked in a height direction from a first replica 9-1 to an Lth replica 9-L. Then, only a coupling coefficient W in the height direction is changed while fixing the temperature T during annealing. For example, the coupling coefficient W is gradually strengthened.

As shown in Equation (14), each replica has a combination of the same coupling $J_{ij}$·bias coefficient $h_i$. Therefore, in the case of constructing a circuit that implements SQA for the Ising model, a memory cell representing the coefficients $J_{ij}$ and $h_i$ in the spin unit 40 may be shared by a plurality of spin units. That is, an operation of a plurality of replicas can be reproduced by one spin unit 40. In this way, an increase in memory consumption is suppressed, so that the number of replicas L can be increased.

Figure 10:
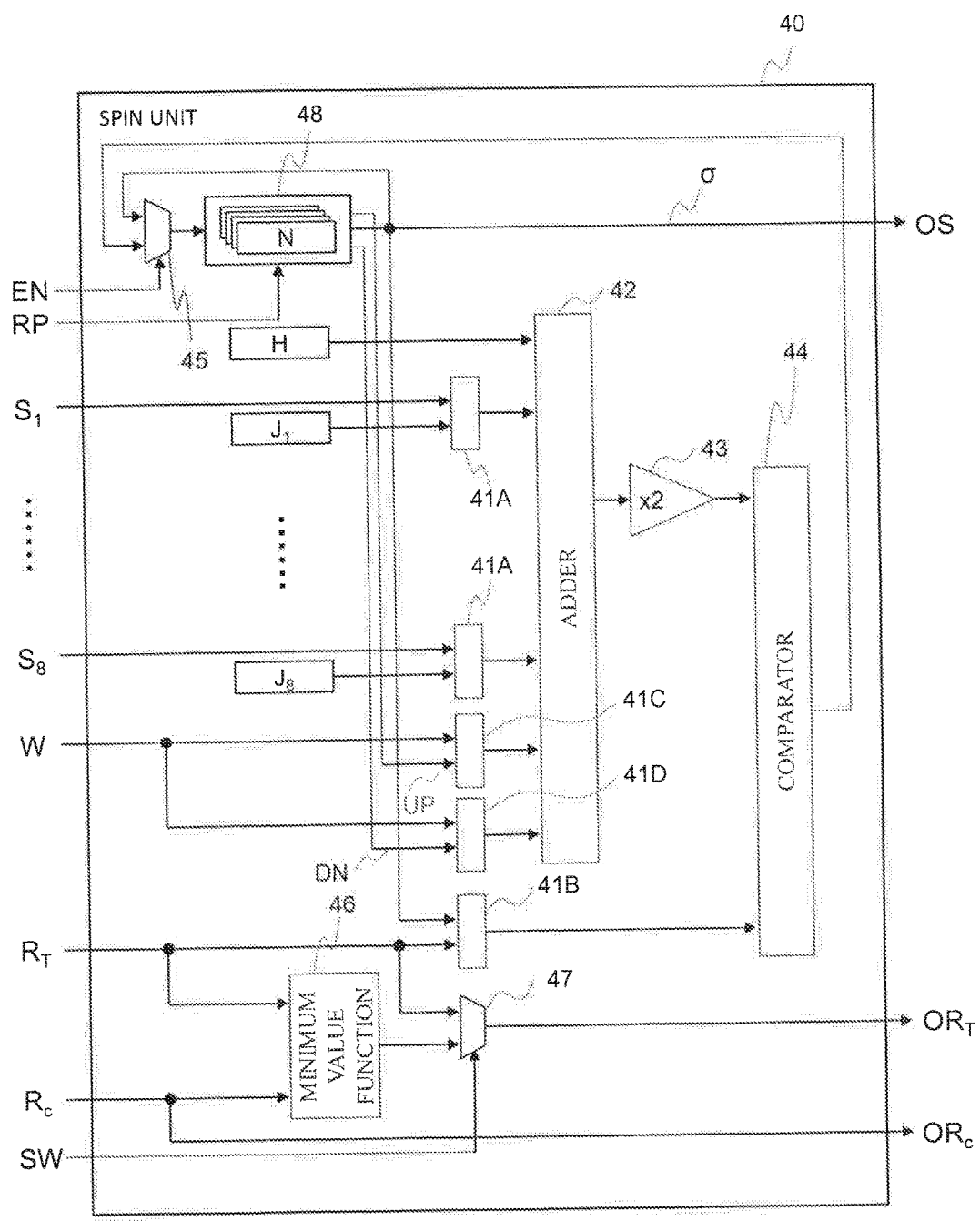
FIG. 10 is a block diagram illustrating another configuration of the spin unit.

FIG. 10 illustrates a configuration example of a spin unit of a type sharing a memory cell representing spin. Configurations similar to those in FIG. 7 are denoted by the same reference numerals, and description thereof is omitted. A main difference is that the memory cell N that stores the spin value can store spins corresponding to the number of replicas L and the coupling coefficient W between the replicas is introduced. In addition, for control, the selector 47 is fixed so that the control signal SW constantly outputs $R_T$ so as to keep the temperature constant, so that $OR_T = R_T$ at all times. However, when it is necessary to change the temperature T, the temperature T may be changed. The spin unit of $N_{11}$ described in FIG. 5 holds the spin value of the spin unit corresponding to $N_{11}$ of each replica of a layer L stacked in the vertical direction of FIG. 9. Therefore, as illustrated in FIG. 9, in the case of realizing a replica of the layer L, the capacity of the memory cell 48 is L bits.

The signal line RP indicates a replica to be subjected to spin update. For example, the signal line RP indicates a spin included in an uppermost layer (first replica) 9-1 illustrated in FIG. 9 in the case of RP=1, and indicates a spin included in a second layer (second replica) 9-2 in the case of RP=2. The signal line RP designates the same replica for all the spin units 40. That is, in the present embodiment, replicas are processed one by one in order. For example, the value of RP is incremented one by one, and returns to 1 at the time of reaching L. According to the signal RP, the spin σ of the corresponding replica (layer) is read from/written to the memory cell 48. Since processing is carried out for each replica at the time of performing coupling calculation, the signals OS, $S_1$ to $S_8$ of FIG. 10 input and output the spin of the first replica when RP=1 and input and output the spin of the second replica when RP=2.

The signal W represents coupling acting between replicas, which corresponds to the coefficient of the third term in the parenthesis of Equation (14), and all couplings among the replicas are equal as shown by this equation. For example, this value corresponds to M bits and is generated by the multi-Ising chip 6 and distributed to each spin unit 40 similarly to the random number generator 8. Multipliers 41C and 41D correspond to 1-bit multipliers. Among the respective input signals, spins UP and DN of replicas existing above and below a replica designated by the signal line PP are given from the memory cell 48 in the signal on the 1 bit side. The multipliers 41C and 41D output the sign of the coupling coefficient W without change or after inversion based on a value indicated by the spin of the replica.

The coupling W in the height direction acts between the uppermost replica 9-1 and the lowermost replica 9-L, so that in the uppermost replica 9-1, as the upper spin UP, spin values are read from the lowermost replica 9-L. In addition, the lowest replica 9-L reads the spin value from the uppermost replica 9-1 as the lower spin DN. In this case, the periodic-boundary condition is set in the height direction.

As another calculation method, the height direction may correspond to an open-boundary condition. In this case, it is presumed that there is no coupling between the uppermost replica 9-1 and the lowermost replica 9-L. In addition, since there is no upper spin in the uppermost replica, the spin value is set to 0 or the coupling W is set to 0. This description is similarly applied to the lowermost replica 9-L. These conditions can be set by the user.

Figure 11:
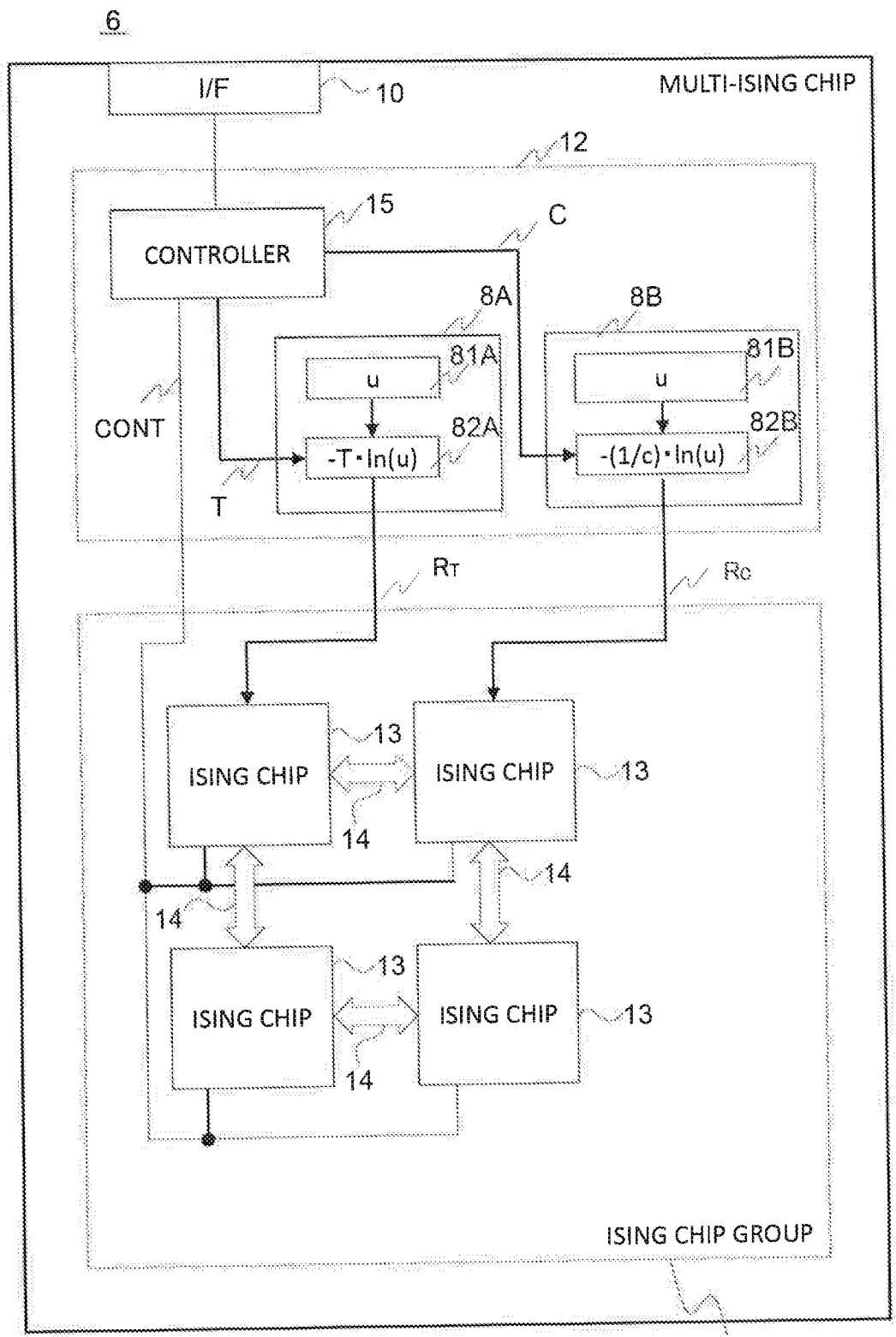
FIG. 11 is a block diagram illustrating another example of a configuration of a multi-Ising chip in an embodiment.

In the configuration example of the spin unit illustrated in FIG. 11, only the memory cell 48 corresponds to a circuit that increases as the number of replicas L increases. Increasing the number of replicas L is important for improving the solution accuracy of SQA.

Embodiment 3

FIG. 11 is a diagram illustrating another configuration example of the multi-Ising chip 6. Portions similar to those of the example of FIG. 3 of Embodiment 1 are denoted by the same reference numerals, and description thereof will be omitted. For the sake of description, the SRAM compatible interface 30 and the coupling control interface 35 of FIG. 3 are omitted. However, it is presumed that this part is configured similarly to that of the example of FIG. 3.

In FIG. 8 of Embodiment 1, the random number generators 8A and 8B are provided for each Ising chip 13. However, in the example of FIG. 11, the random number generators 8A and 8B are common to the Ising chip 13.

The random number generator 8A includes a uniform random number generator 81A and an arithmetic unit 82A which performs logarithmic calculation and multiplication with the temperature T. The temperature T which is a parameter set by the user is given to the arithmetic unit 82A from the controller 15. The uniform random number generator 81A generates a uniform random number u, and the arithmetic unit 82A performs logarithmic operation of $-T \cdot \ln(u)$. Since the establishment variable is a nonnegative value, the sign is inverted. As a result, the random number $R_T$ generated by the random number generator 8A is input to one of the Ising chips 13.

The random number generator 3B includes a uniform random number generator 81B and an arithmetic unit 82B which performs logarithmic calculation and multiplication with the temperature 1/c. A constant c which is a parameter set by the user is given from the controller 15 to the arithmetic unit 82B. The uniform random number generator 81B generates a uniform random number u, and the arithmetic unit 82B performs logarithmic operation of $-(1/c)/\ln(u)$. Since the establishment variable is a nonnegative value, the sign is inverted. The random number R generated by the random number generator 8B is input to one of the Ising chips 13.

The random number $R_T$ and the random number $R_c$ input to one Ising chip 13 are transmitted so that the respective random numbers pass through all the Ising chips 13 via the Inter-chip wires 14. Even within each Ising chip 13, transmission via all the spin units is performed. In FIG. 8, random numbers from the random number generators 8A and 8B have the same paths in opposite directions. However, since it is sufficient for random numbers to be independent for each spin unit as much as possible, when paying attention to a certain spin unit, it suffices for the random number $R_T$ and the random number $R_c$ to come from separate spin units. Specifically, it is sufficient that the random number $R_T$ and the random number $R_c$ are different from each other in at least one of path and direction.

When it is considered that generation of the random number $R_T$ and the random number $R_c$ and calculation in the spin unit 40 are executed within a predetermined cycle defined by the clock, calculation may not be performed unless two types of random numbers reach all the spin units, and thus a preparation period of "the number of spin units×cycle" is required at the maximum. For example, when the random number generators 8A and 8B are commonly used in the plurality of Ising chip 13 as in FIG. 11, the total number of spin units corresponds to "the number of Ising chips×the number of spin units per Ising chip". The number of spin units per Ising chip is, for example, 10,000 (100×100). In this case, a preparation period of 4×10,000 cycles (in the case of FIG. 11) is necessary.

During the preparation period, for example, the value of the spin is fixed and not changed as the random number $R_T = OR_T$. To this end, the selector 45 is controlled by the signal EN of FIG. 7 to fix the value of the memory cell N, and the selector 47 is controlled by the signal SW such that the random number $R_T$ continues to flow without change.

The path of the random number and the path of the SRAM compatible interface 30 are independent from each other. Thus, during the preparation period, supply of random numbers and storage of data and coefficients can be performed in parallel by performing a process of reading the coefficients from the memory 4 and storing values in a memory cell H, J, or N of each spin unit.

In the present embodiment, the multi-Ising chip is configured as hardware such as a field programmable gate array (FPGA), an application specific integrated circuit (ASIC), etc. The same function may be realized by a software configuration that causes a general-purpose processor to execute a program. The above description is similarly applied to FIG. 8. However, the process may be terminated by not performing further output at terminals of the random number $R_T$ and the random number $R_c$.

Embodiment 43

Figure 12:
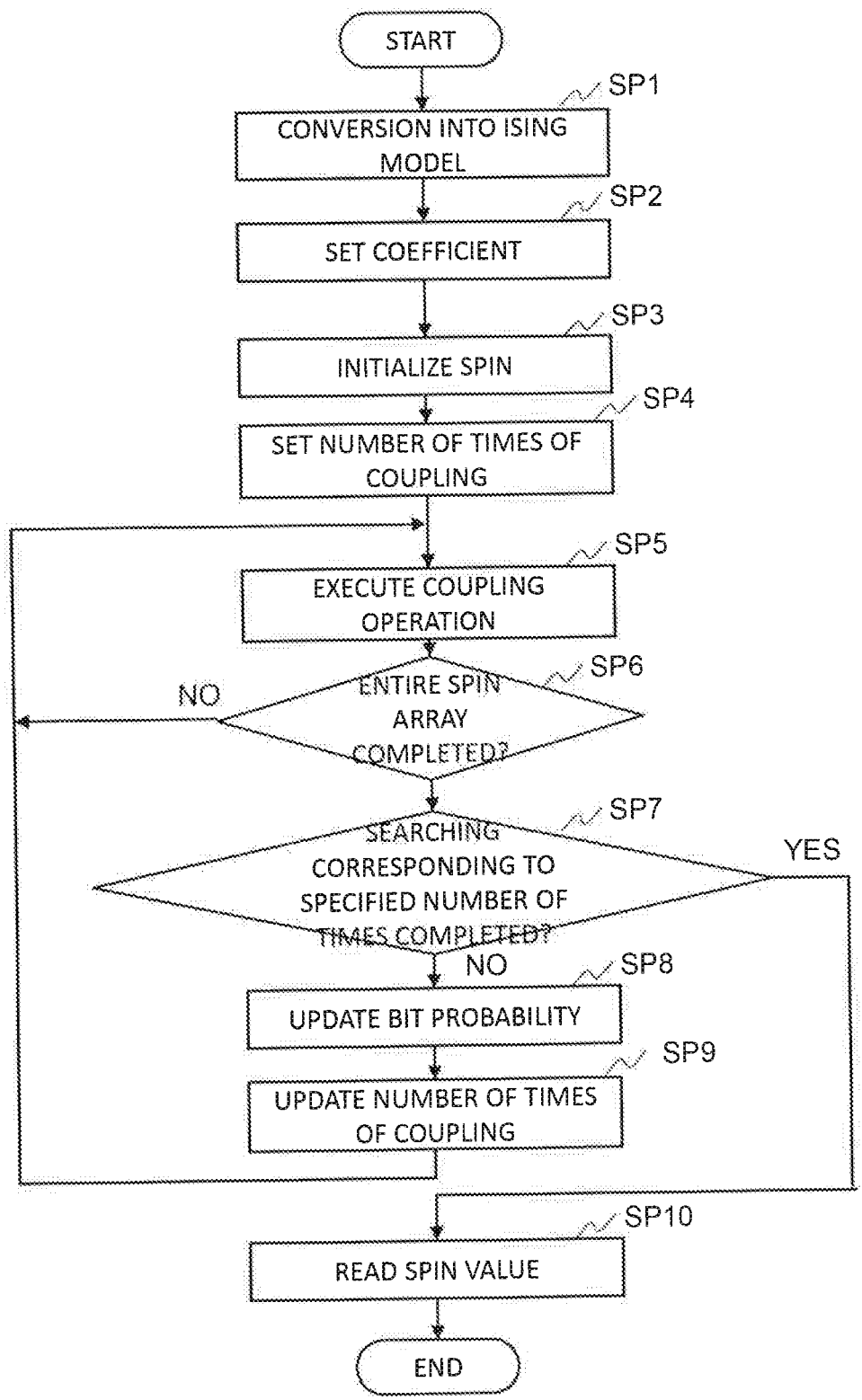
FIG. 12 is a flowchart illustrating a processing procedure of MCMC.

A control procedure of the Ising chip will be described. FIG. 12 is a flowchart illustrating a processing procedure of MCMC in the present embodiment.

FIG. 12 illustrates a processing procedure of a process of a search for a ground state executed by the CPU 3 (FIG. 1) in the information processing apparatus 1 of the present embodiment. This process mainly describes a spin update process by a coupling operation.

The CPU 3 processes step SP1 based on a problem conversion program (not illustrated). With regard to subsequent processes (step SP2 to step SP11), the search for the ground state is executed in the Ising chips 13 by controlling the Ising chips 13 in the multi-Ising chip 6 through the controller 15 (FIG. 2) of the necessary multi-Ising chips 6 (FIG. 2) based on the multi-Ising chip control program 9 (FIG. 1). The process of step SP1 and the processes of step SP2 to step SP11 may be executed at different timings.

In addition, in practice, the CPU 3 controls the Ising chip 13 in each multi-Ising chip 6 and the spin unit 40 in the Ising chip 13 through the controller 15 (FIG. 2) in the multi-Ising chip 6. However, in description below, for easier understanding, the presence of the controller 15 will be omitted for description.

Upon starting this process of the search for the ground state by an instruction from the user, etc., first, the CPU 3 converts the problem data 7 (FIG. 1) into data in the form of the Ising model (step SP1). When the problem data 7 corresponds to data in the form of the Ising model, step SP1 is omitted.

Subsequently, the CPU 3 sets the coupling coefficient $J_i$ and the bias coefficient h of the Ising model after conversion in each spin unit 40 in each Ising chip 13 of the necessary multi-Ising chip 6. In addition, the CPU 3 stores the temperature T, the constant c, the number of changes in the temperature k, the control signal EN of the selector 45, and the control signal SW of the selector 47, which are parameters for executing the process of the search for the ground state input by the user in advance in the controller 15 (step SP2).

Subsequently, an initial spin configuration is generated to initialize the spin. In the present embodiment, all numerical values may be the same value. However, an initial value of a spin is normally a random value. The coefficients and the initial spin configuration are written to the memory cell N of the spin array based on a memory map (step SP3).

The number of times m of coupling is set (step SP4). The coupling operation is executed (step SP5), and it is determined whether execution has completed with respect to the entire spin array 20 (step SP6). When the execution is incomplete, the coupling operation is executed on the subsequent spin array 20 (step SP5). When execution is completed for the entire spin array 20, it is determined whether execution corresponding to the specified number of times (m times) of coupling has been performed (step SP7). When execution is incomplete, the bit probability is updated (step SP8), the number of times of coupling is incremented (step SP9), and the coupling calculation is continued. Here, updating of the bit probability is executed by setting the output of the minimum value function 46 to $OR_T$ by switching of the selector 47.

When execution corresponding to the specified number of times of coupling is completed, the spin value is read (step SP10). Then, thereafter, the CPU 3 ends the process of the search for the ground state. In this way, MCMC may be performed.

In the present embodiment, each Ising chip 13 searches for the ground state of the same model, and common settings are made from the coefficient setting (step SP2) to the setting of the number of times of coupling (step SP4). However, in the coupling operation after SP5, each spin unit leads probabilistically different results by the random number $R_T$ and the random number $R_c$.

The semiconductor device and the information processing apparatus of the present embodiment described above can be easily and inexpensively manufactured. For example, it is possible to calculate an arbitrary coupling model such as the Ising model. That is, in the information processing apparatus of the present embodiment, it is possible to execute parallel calculation of state transitions based on the metropolis algorithm while suppressing multipliers and arithmetic circuits of nonlinear functions. Specifically, the random number generator is common to the plurality of spin units 40, and a circuit for multiplying the random number and the parameter is shared by the plurality of spin units 40. In the spin unit 40, parts related to the multiplication/nonlinear function can be integrated into the random number generator 8 by utilizing a mixture of exponential distributions based on the minimum value function. In this way, it is possible to easily and inexpensively manufacture the information processing apparatus for accurately obtaining the ground state of the Ising model or the approximate solution of the base state and sampling with high accuracy.

According to the present embodiment, the state transition based on the metropolis algorithm can be executed with high accuracy while suppressing the circuit scale with respect to the coupling model represented by the Ising model. That is, it is possible to eliminate a pseudo random number generator or large calculation such as multiplication, a nonlinear function, etc. from a parallel calculation unit. For example, it is possible to perform calculation at high speed for any arbitrary coupling network of the Ising model, etc. According to the present embodiment, a simulated annealing method using commonly used temperature scheduling is realized using a minimum value function instead of the multiplier in the parallel calculation section.

In addition, it is possible to realize a simulated/quantum annealing method based on the path integral method for the Ising model by performing the state transition based on the metropolis algorithm with the temperature kept constant. In this case, as in the above description, it is possible to perform calculation at high speed by eliminating the pseudo random number generator or large calculation such as multiplication, a nonlinear function, etc. from the parallel calculation unit. In addition, in the Hamiltonian obtained by applying Suzuki-Trotter decomposition, since each replica has a common coefficient, memory cells can be shared. Using this structure realizes the simulated/quantum annealing method for the Ising model while suppressing memory consumption.

Even though the invention made by the inventors has been concretely described based on the embodiments, the invention is not limited to the above-mentioned embodiment, and various modifications can be made without departing from the subject matter.

For example, the above-described embodiments have been described in detail in order to describe the invention in an easy-to-understand manner, and are not necessarily limited to those having all the configurations described. Further, a part of a configuration of a certain embodiment can be replaced with a configuration of another embodiment. In addition, a configuration of a certain embodiment can be added to a configuration of another embodiment. In addition, it is possible to add, delete, and replace another configuration with respect to a part of a configuration of each embodiment.

REFERENCE SIGNS LIST 1 information processing apparatus
2 system bus
3 CPU
4 memory
5 storage device
6 multi-Ising chip
7 problem data
8 random number generator
9 multi-Ising chip control program
11 Ising chip group
12 controller
13 Ising chip
14 inter-chip wire
15 controller
16 coupling clock generator
20 spin array
24 inter-chip connection unit
40 spin unit
44 comparator

The invention claimed is:

1. An information processing apparatus comprising:
one or a plurality of array circuits,
wherein each of the array circuits includes a plurality of units,
each of the plurality of units includes
a first memory that stores a value indicating a state of one node of a coupling model,
a second memory that stores a coupling coefficient indicating coupling from a node of another unit connected to a unit of the second memory, and
a logic circuit that determines a value indicating a subsequent state of the one node based on a value indicating a state of the node of the other unit and the coupling coefficient, and
the logic circuit sets a first random variable in accordance with an exponential distribution of a parameter θ as an input,
wherein a process of updating the state of the one node by the logic circuit is performed on a premise of a schedule in which a reciprocal of a temperature T corresponds to an equal interval c when a parameter indicating easiness of transition of the state of the one node of the coupling model is set to the temperature T, and
the first random variable is set to −T·ln(u) (where u is a uniform random number greater than 0 and less than 1),
wherein a first random number generator that generates the first random variable is shared by the plurality of units, and
each of the units allows the input first random variable to be input to another unit without change,
wherein the logic circuit sets a second random variable in accordance with an exponential distribution of the parameter θ as an input,
a second random number generator that generates the second random variable is shared by the plurality of units,
the second random variable corresponds to −(1/c)·ln(u) (where u is a uniform random number greater than 0 and less than 1), and
the logic circuit includes a fourth arithmetic unit that sets the first random variable and the second random variable as an input to calculate a minimum value function, and
a selector that selects the first random variable and an output of the fourth arithmetic unit and allows the selected first random variable and output of the fourth arithmetic unit to be input to another unit,
wherein a temporal change of the temperature T is controlled by a control signal SW that controls the selector.

2. The information processing apparatus according to claim 1, wherein the logic circuit includes
a first arithmetic unit that sets the value indicating the state of the node of the other unit and the coupling coefficient as an input, and outputs a sign of the coupling coefficient without change or after inversion based on the value indicating the state of the node of the other unit,
a second arithmetic unit that sets a value indicating a state of the one node and the first random variable as an input, and outputs a sign of the first random variable without change or after inversion based on the value indicating the state of the one node,
a third arithmetic unit that doubles an output of the first arithmetic unit,
a comparator that sets outputs of the second arithmetic unit and the third arithmetic unit as an input, and selectively outputs a value based on a magnitude relation of two inputs, and
a signal line that stores an output of the comparator in the first memory.

3. The information processing apparatus according to claim 2,
wherein the logic circuit
sets a value indicating states of nodes of a plurality of other units as an input,
includes a plurality of second memories associated with the nodes of the plurality of other units,
includes a plurality of first arithmetic units that sets the value indicating the states of the nodes of the other units and the coupling coefficient stored in the second memory associated therewith as an input, and
includes an adder that adds outputs of the plurality of first arithmetic units, and
the third arithmetic unit doubles an output of the adder.

4. The information processing apparatus according to claim 3, wherein the comparator outputs a first value when an output of the third arithmetic unit is greater than or equal to an output of the second arithmetic unit, and outputs a second value when the output of the third arithmetic unit is less than the output of the second arithmetic unit.

5. The information processing apparatus according to claim 3,
wherein each of the plurality of units
includes the first memory that stores a value indicating a plurality of replicas of the state of the one node of the coupling mode, and
sets a coupling coefficient W between the plurality of replicas as an input, and
the logic circuit
includes a fifth arithmetic unit that sets a value indicating a first replica among the replicas and the coupling coefficient W as an input, and outputs a sign of the coupling coefficient W without change or after inversion based on the value indicating the first replica,
inputs an output of the fifth arithmetic unit to the adder to perform addition, and
determines a value indicating a subsequent state of a value indicating a second replica among the replicas based on an output of the comparator.

6. The information processing apparatus according to claim 1, wherein a first signal path for supplying the first random variable to logic circuits of the plurality of units and a second signal path for supplying the second random variable to the logic circuits of the plurality of units are different from each other in at least one of path and signal propagation direction.

7. The information processing apparatus according to claim 6, wherein each of the units allows the input second random variable to be input to another unit without change.

8. The information processing apparatus according to claim 1,
wherein the first random number generator and the second random number generator are disposed for each of the array circuits or commonly arranged in the plurality of array circuits.

9. An information processing method using an information processing apparatus including array circuits,
wherein each of the array circuits includes a plurality of units,
each of the plurality of units includes
a first memory that stores a value indicating a state of one node of a coupling model,
a second memory that stores a coupling coefficient indicating coupling from a node of another unit connected to a unit of the second memory, and
a logic circuit that determines a value indicating a subsequent state of the one node based on a value indicating a state of the node of the other unit and the coupling coefficient,
a process of updating the state of the one node with the subsequent state by the logic circuit is performed on a premise of a schedule in which a reciprocal of a temperature T corresponds to an equal interval c when a parameter indicating easiness of transition of the state of the one node is set to the temperature T, and
a first random variable expressed by $-T \cdot \ln(u)$ (where u is a uniform random number greater than 0 and less than 1) is generated by a first random number generator commonly provided to the plurality of units, and supplied by a first signal path passing through the plurality of units in series,
wherein a second random variable expressed by $-(1/c) \cdot \ln(u)$ (where u is a uniform random number greater than 0 and less than 1) is generated by a second random number generator commonly provided to the plurality of units, and supplied by a second signal path passing through the plurality of units in series,
wherein the logic circuit includes a fourth arithmetic unit that sets the first random variable and the second random variable as an input to calculate a minimum value function, and
a process of selecting, by a selector, the first random variable and an output of the fourth arithmetic unit and allows the selected first random variable and output of the fourth arithmetic unit to be input to another unit,
wherein a temporal change of the temperature T is controlled by a control signal SW that controls the selector.

10. The information processing method according to claim 9,
wherein
a third random variable in accordance with an exponential distribution of a parameter $1/T+c$ is obtained based on the first random variable and the second random variable in the unit, and the third random variable is allowed to be transmitted to another unit instead of the first random variable.

11. The information processing method according to claim 10, wherein the first signal path and the second signal path supply signals to the plurality of units such that the signals are different from each other at least in path and signal propagation direction.

* * * * *